US006639807B1

(12) United States Patent
Carney et al.

(10) Patent No.: US 6,639,807 B1
(45) Date of Patent: Oct. 28, 2003

(54) CARD RETENTION MECHANISM

(75) Inventors: James M. Carney, Pepperell, MA (US); William A. Izzicupo, Bedford, NH (US); Robert S. Antonuccio, Burlington, MA (US); Timothy M. Holland, West Boylston, MA (US)

(73) Assignee: Sun Microsoft, Inc., Palo Alto, CA (US)

( * ) Notice: Subject to any disclaimer, the term of this patent is extended or adjusted under 35 U.S.C. 154(b) by 0 days.

(21) Appl. No.: 09/546,101

(22) Filed: Apr. 10, 2000

(51) Int. Cl.$^7$ .............................. H05K 5/00; H05K 5/04; H05K 5/06
(52) U.S. Cl. .................. 361/759; 361/801; 361/802
(58) Field of Search ................................. 361/754–755, 361/759, 801–802; 312/183, 265.6

(56) References Cited

U.S. PATENT DOCUMENTS

| 5,575,546 A | * | 11/1996 | Radloff | 312/183 |
| 5,601,349 A | * | 2/1997 | Holt | 312/265.6 |
| 5,640,309 A |   | 6/1997 | Carney et al. | |
| 5,673,175 A |   | 9/1997 | Carney et al. | |
| 5,748,453 A |   | 5/1998 | Carney et al. | |
| 6,094,353 A | * | 7/2000 | Koerber et al. | 361/754 |
| 6,215,668 B1 | * | 4/2001 | Hass et al. | 361/759 |
| 6,215,673 B1 | * | 4/2001 | Gordon et al. | 361/801 |

* cited by examiner

*Primary Examiner*—Kamand Cuneo
*Assistant Examiner*—Tuan Dinh
(74) *Attorney, Agent, or Firm*—Meyertons, Hood, Kivlin, Kowert & Goetzel, P.C.; Eric B. Meyertons

(57) ABSTRACT

A card retention mechanism securely holds a card within a slot on a circuit board. The retention mechanism may include a carrier and a retainer. The carrier mounts to a chassis of the computer system adjacent to the card slot. The retainer may be pivotally mounted to the carrier. When the retainer is in a closed position, at least one surface of the retainer engages an endplate of the card, and the retainer engages the carrier. The engagement of the retainer and the carrier inhibits rotation of the retainer from the closed position to an open position. When the retainer is in the closed position, the retainer securely holds the card to the chassis of the computer system.

8 Claims, 3 Drawing Sheets

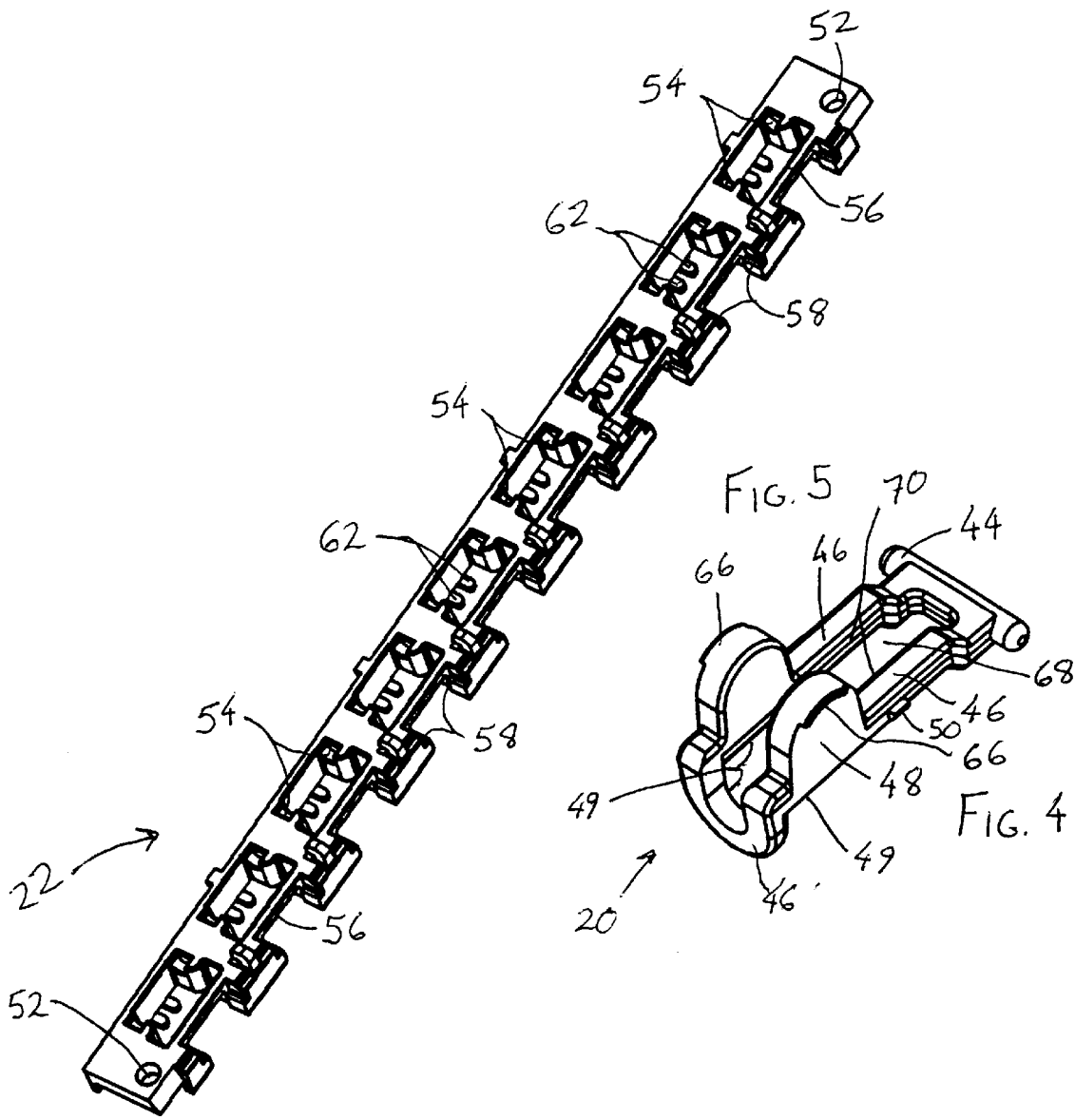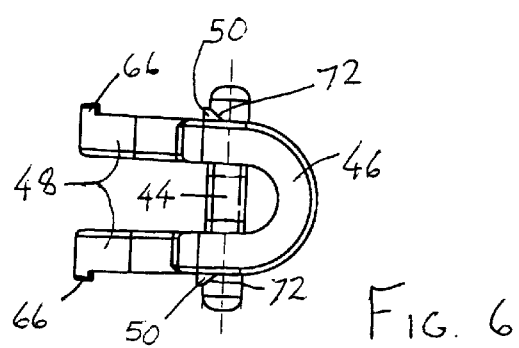

CARD RETENTION MECHANISM

BACKGROUND OF THE INVENTION

1. Field of the Invention

This invention generally relates to computer component mounting systems, and more particularly to a retention mechanism for a removable electronic card for a computer system, such as a peripheral component interconnect (PCI) card. In one embodiment, the retention mechanism may allow a PCI card to be securely installed into a running computer system.

2. Description of the Related Art

A computer system may use removable electronic cards to contain subsystems or other assemblies that form part of the operating hardware of the system. For example, graphics cards, modems, audio cards, and other PCI cards may be plugged into a system to add functionality to the computer system. Removable electronic cards may allow a user to tailor a computer system to meet specific needs.

A card may function as a hardware interface between a computer system processor and a peripheral device. Peripheral devices may include, but are not limited to video displays, printers, disks, and networks. Generally, a card includes a circuit board and an endplate. The circuit board may have a connector that has a number of electrical contacts. The connector may be adapted to fit within a socket that is electrically coupled to a circuit board of the computer system. The circuit board may be electrically connected to the computer system processor. The endplate of the card may be used to secure the card to the chassis of the computer system. The endplate and the computer system sheet metal adjacent to the endplate may form part of an electromagnetic interference (EMI) seal for the computer system. The endplate may have a number of device connectors that allow cables or connection systems to electrically couple the peripheral device to the computer system.

A computer system typically has several sockets adapted to mate with the electrical contacts of a card. When a card is not installed in a socket, a blanking cover may be used to cover the opening in a computer system enclosure where the endplate of a card would be positioned. The blanking cover may function as a computer system safety precaution to prevent the insertion of foreign material into the computer system. The blanking cover may also serve as part of the EMI seal for the computer system. The shape of a blanking cover typically resembles the shape of an endplate of a card.

The endplate of a card may be used to attach a card to a computer system chassis. The endplate of the card may have a tongue at one end and a tab at the other end. The tab is typically perpendicular to the tongue, and the tab may have a hole or slot. The tongue may fit within a tongue slot on the computer chassis. When the tongue is placed in the tongue slot, the hole or slot on the tab aligns with a hole in the chassis. A fastener, such as a small screw, may be inserted through the hole or slot and into the computer chassis to secure the endplate to the computer system chassis. Securing the endplate to the computer system chassis inhibits the contacts of the card from becoming disengaged from the socket on the circuit board.

A common problem with retaining a card within a computer system using a fastener is that handling the fastener may be difficult. Typically, the fastener used to secure a card endplate to the computer chassis is a small screw. Handling a small screw can be difficult, especially in the tight confines of a computer enclosure. Alternate systems for attaching blanking covers and PCI cards to a computer system are shown in U.S. Pat. No. 5,640,309 issued to Carney et al.; U.S. Pat. No. 5,673,175 issued to Carney et al.; and U.S. Pat. No. 5,748,453 issued to Carney et al. (all three of these patents are incorporated by reference as if fully set forth herein).

A trend in the computer industry is to have cards that may be installed in a computer system while the computer system is running. A "hot pluggable card" is a card that may be installed in a computer system while the computer system is running. The development of hot pluggable cards has led to the need to develop a card retention mechanism that generally does not use separate component fasteners to hold cards in place. A retention mechanism that generally does not use separate fasteners is needed due to the possibility that a user might drop a separate component fastener into the computer system during installation or removal of a card. Dropping a fastener into an operating computer system could damage the computer system.

SUMMARY OF THE INVENTION

An embodiment of a card retention mechanism may securely hold an electronic card or blanking cover within a computer system. Retention mechanism embodiments may securely hold cards or blanking covers to a chassis of the computer system. A card retention mechanism may include a carrier and at least one retainer. The carrier may mount to a chassis of a computer system. The carrier may be positioned near openings in the chassis that accommodate blanking covers or card endplates. Retainers may be rotatably mounted to the carrier. Preferably, the carrier holds one retainer for each blanking cover or endplate opening in the chassis.

When a retainer holds a card within a card slot, the retainer may be locked in a closed position. In the closed position, the side projections of the retainer may engage rotation inhibiting surfaces on the carrier to prevent the retainer from rotating to an open position. When a user desires to remove a blanking cover or card, the retainer may be gripped, the side projections may be withdrawn so that the side projections do not contact the rotation inhibiting surfaces, and the retainer may be rotated away from the blanking cover or card.

When the retainer does not engage a blanking cover or endplate, the retainer may engage a rotation stop to hold the retainer in an open position. When the retainer is held in an open position by the rotation stop, the retainer will generally not interfere with the installation, maintenance, or removal of blanking covers or cards.

An advantage of retention mechanism embodiments is that the retention mechanisms may reduce or eliminate the need for separate component fasteners to secure cards or blanking covers to a computer system. Retention mechanism embodiments may be used in conjunction with other fasteners in particular systems. Another advantage of retention mechanism embodiments is that the retention mechanisms do not interfere with EMI seals formed between the chassis of the computer system and the card endplates or blanking covers. Another advantage of retention mechanism embodiments is that retainers of the retention mechanisms may be held in open positions so that the retainers do not interfere with installation, maintenance or removal of cards or blanking covers. Another advantage of retention mechanism embodiments is that the mechanisms will inhibit connectors of cards from becoming disengaged from circuit board sockets during use.

When the card is a PCI card installed in a computer system, attaching a peripheral device to the computer system may subject the card and the computer system to significant forces. The forces may be applied during attachment and removal of cables, or other types of connectors, into the card endplate. The forces applied to the endplate and the computer system must be resisted so that the card is held securely in place. An advantage of retention mechanism embodiments is that the mechanisms are sturdy and can withstand forces applied to the endplates while still securely holding cards within the computer system. Retention mechanism embodiments are able to hold cards securely in place, maintain the EMI seal between the chassis and the endplate, and prevent the contacts of the cards from being uncoupled from circuit board sockets during use.

Another advantage of retention mechanism embodiments is that different colors may be used for different components of the mechanisms. The different component colors may help a user who has never seen or used a retention mechanism to intuitively use the retention mechanism properly. Other advantages of retention mechanism embodiments may include that the retention mechanisms are durable, light weight, simple, efficient, reliable and inexpensive; yet the retention mechanisms may also be easy to manufacture, install, maintain and use.

BRIEF DESCRIPTION OF THE DRAWINGS

FIG. 4 is a perspective view of a carrier that may hold nine retainers;

FIG. 5 is a perspective view of a retainer; and

FIG. 6 is a top elevational view of a retainer;

Figure 1:
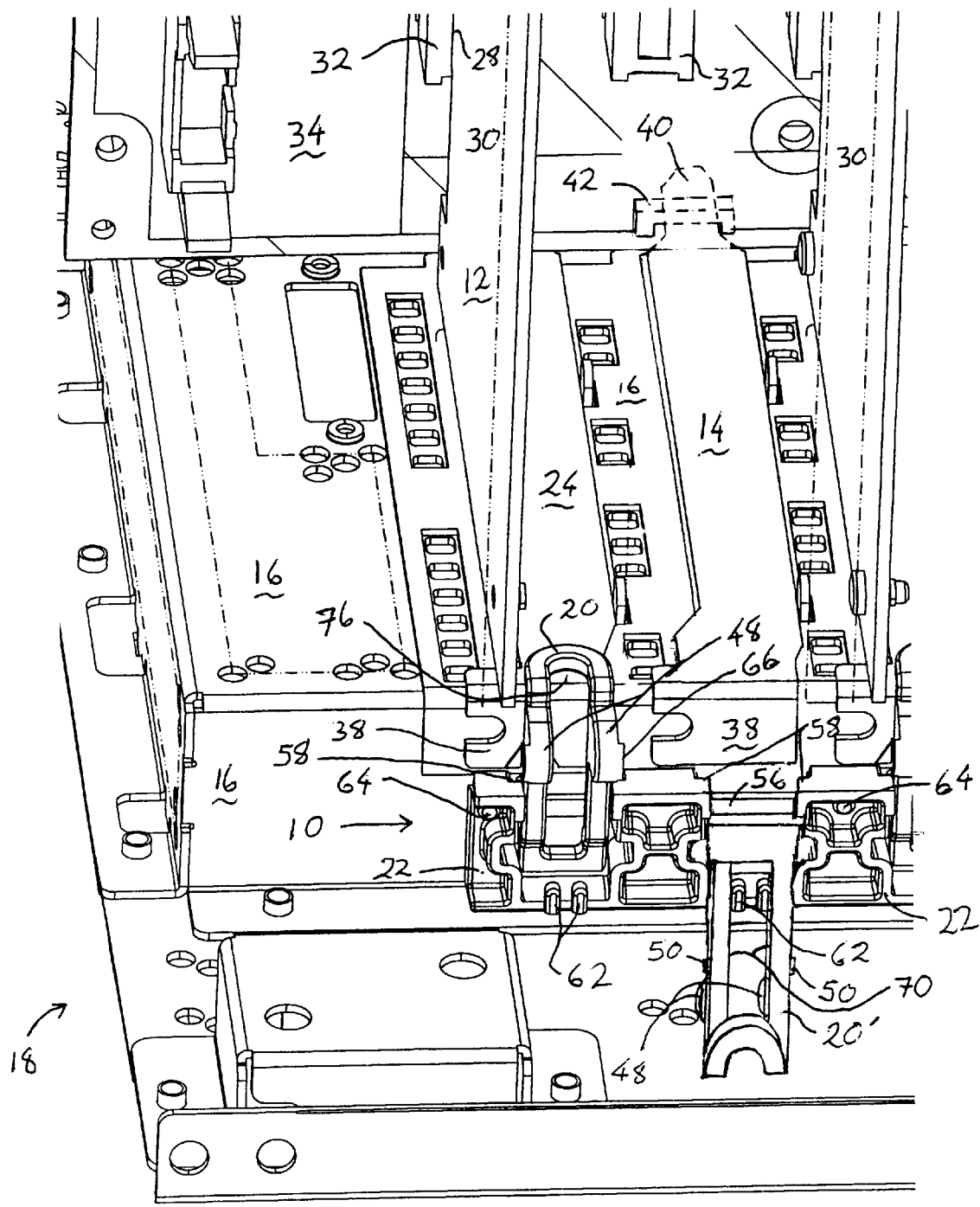
FIG. 1 is a perspective view of a retention mechanism having a number of retainers, wherein one retainer in a closed position holds a PCI card within a computer system, and wherein another retainer is in an open position.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF THE PREFERRED EMBODIMENTS

Referring to the drawings, and particularly to FIG. 1, a retention mechanism for holding an electronic card within a computer system is designated generally as 10. For illustrative purposes only, the retention mechanism 10 will be described as being used with PCI cards 12 and/or with blanking covers 14. It is to be understood, however, that the retention mechanism 10 may be used with other electronic cards, components, and/or devices.

The retention mechanism may be used to secure a PCI card 12 or a blanking cover 14 to chassis 16 of computer system 18. The retention mechanism 10 may include retainer 20 and carrier 22. A number of retainers 20 may be rotationally mounted to the carrier 22 to form a retention mechanism 10. When a retainer 20 is in a closed position, the retainer may contact endplate 24 of a PCI card 12, or a blanking cover 14. The retainer 20 securely holds the PCI card 12 or blanking cover 14 to the chassis 16 of the computer system 18. When the retainer is in an open position, the retainer may be positioned so that the retainer will not interfere with installation, maintenance, or removal of PCI cards 12 or blanking covers 14. FIG. 1 illustrates a PCI card 12 that is being held in place by a first retainer 20 of the retention mechanism 10. The retainer 20 is in a closed position. FIG. 1 also illustrates a second retainer 20' in an open position.

Figure 2:
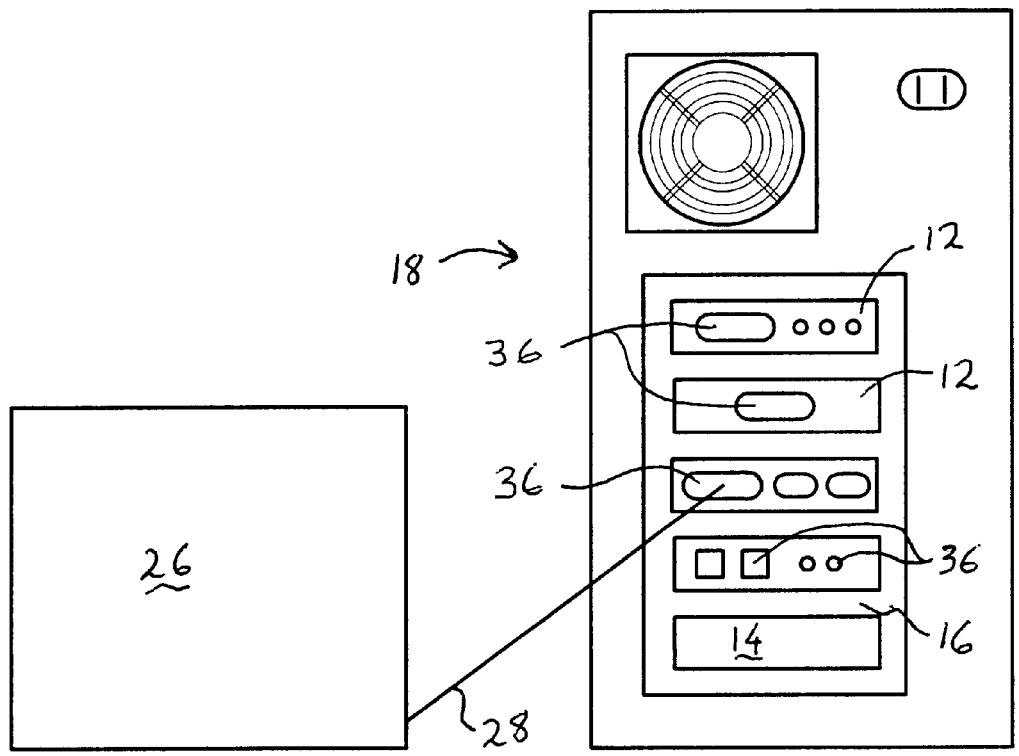
FIG. 2 is a diagrammatic representation of a peripheral device that is attached to a computer system.

A PCI card 12 may provide a high-speed data pathway between a processor (not shown) and peripheral device 26 (shown in FIG. 2). A PCI card 12 may function as a hardware interface between the peripheral device 26 and a computer system processor. Typically, a PCI card 12 has at least one connector edge 28 with a plurality of electrical contacts (not shown), printed circuit board 30 and an endplate 24. A plurality of electrical components (not shown) may be mounted to the PCI card circuit board 30. The contacts of the PCI card 12 fit within socket 32 that connects to circuit board 34 within the computer system 18. The circuit board 34 may be connected to a processor within the computer system 18. Inserting the contacts of a PCI card 12 within the socket 32 of a computer system circuit board 34 may electrically couple the PCI card to a processor within the computer system 18. The retention mechanism 10 may secure the PCI card endplate 24 to the chassis 16 of the computer system 18. The endplate 24 and the chassis 16 adjacent to the endplate may form part of an electromagnetic interference (EMI) seal for the computer system 18.

FIG. 2 shows a diagrammatic representation of a computer system 18 connected to a peripheral device 26. Peripheral devices 26 may include, but are not limited to video displays, printers, disks, and networks. The peripheral device 26 may be communicatively coupled to the PCI card endplate 24 by a data transfer conduit, such as cable 28. The cable 28 may attach to PCI card endplate connector 36. PCI card endplates 24 for various types of PCI cards 12 may have different types of connectors 36 and different arrangements of connectors on the PCI card endplates. A significant amount of force may be applied to a PCI card 12 during attachment of a peripheral device 26 to the PCI card. The retention mechanism 10 may be used to securely hold the PCI card 12 to the chassis 16 of the computer system 18 during attachment of a peripheral device 26 to the PCI card. When a PCI card 12 is inserted into a circuit board socket 34 and the retention mechanism 10 holds the PCI card to the computer system chassis 16, the retention mechanism inhibits the contacts of the PCI card from becoming uncoupled from the socket 32 of the computer system 18.

Figure 3:
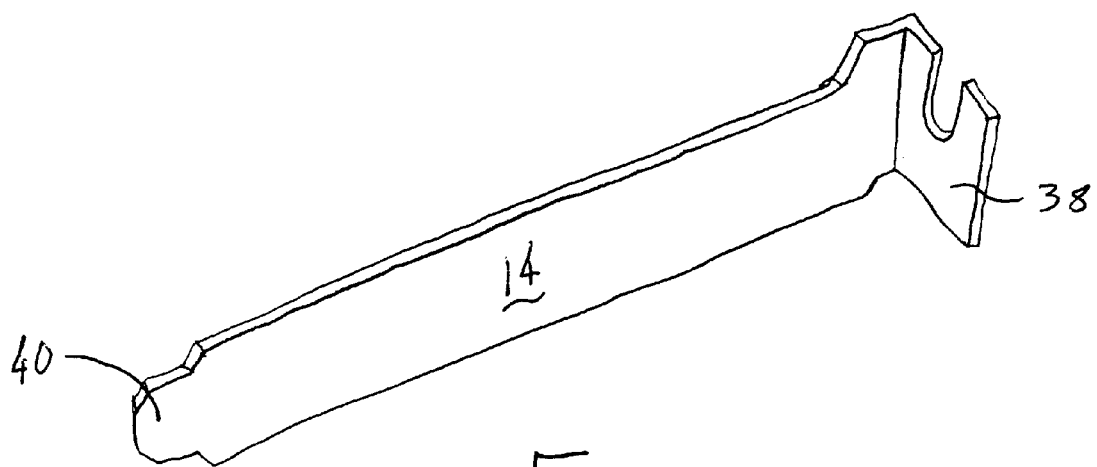
FIG. 3 is a perspective view of a blanking cover.

FIG. 3 shows a perspective view of a blanking cover 14. The blanking cover 14 may have the general shape of a PCI card endplate 24 that has no connectors 36. The blanking cover may be formed of sheet metal. When a PCI card 12 is not installed in an available PCI socket, a blanking cover 14 may be used to cover an opening in the computer system chassis 16 where the endplate of an installed PCI card would be positioned. The blanking cover 14 may function as a computer system safety precaution to prevent the insertion of foreign material into the computer system 18. The blanking cover 14 may also serve as part of the computer system's EMI seal.

A blanking cover 14, and also an endplate 24 of a PCI card 12, may include tab 38, and tongue 40. The tab 38 may be oriented perpendicular to the tongue 40. The tongue 40 may be configured to fit within tongue slot 42 in the chassis 16 of the computer system 18. One embodiment of a tongue slot 42 is shown in hidden lines in FIG. 1. A PCI endplate 24 or blanking cover may be held to the chassis 16 of a computer system by the tongue 40 and tab 38 in combination with the tongue slot 42 and retention mechanism 10. When the tongue 40 is inserted into the tongue slot 42, the retention mechanism 10 may be used to securely hold the tab 38 against the chassis 16.

FIG. 4 shows a perspective view of a retainer 20. FIG. 5 shows a perspective view of a carrier 22 that may hold nine retainers 20. Carriers 22 may be formed that may hold fewer, or more, retainers 20 than the carrier shown in FIG. 5. A retainer 20 may include rotation shaft 44, body 46, grips 48, engagement surfaces 49 and protrusions 50 (only one shown). The carrier may include mounting holes 52, pivot mounts 54, forward rotation stops 56, rotation inhibitor surfaces 58, and rotation stops 62. A forward rotation stop 56 limits the forward rotation of a retainer 20 that is pivotally mounted to the carrier 22. The rotation inhibitor surfaces 58 may inhibit rotation of the retainer 20 from a closed position to an open position. The rotation inhibitor surfaces 58 of the carrier 22 and the protrusions 50 of the retainer 20 form a lock mechanism that may inhibit rotation of the retainer from a closed position to an open position. The rotation stops 62 may inhibit rotation of the retainer from the open position.

The retainer 20 and the carrier 22 may be made of plastic. Suitable plastics that may be used to form the retainer 20 and the carrier 22 are Cycoloy C2950HF, supplied by General Electric Company; or FR110 PC/ABS, supplied by Bayer Corporation. The mounting holes 52 allow fasteners 64 to secure the carrier to the chassis 16, as shown in FIG. 1. A fastener 64 may be any suitable type of fastener, such as a screw, or a nut and bolt.

Ends of the rotation shaft 44 of the retainer 20 may be positioned within the pivot mounts 54 of the carrier 22. When the rotation shaft 44 is positioned in the pivot mounts 54, the retainer 20 may be rotated from an open position to a closed position, or vice versa. When the retainer 20 is locked in the closed position, forward rotation of the retainer may be prevented by the forward rotation stop 56. When the retainer is locked in the closed position, the protrusions 50 on the body 46 of the retainer 20 may engage the rotation inhibitor surfaces 58 to inhibit rotation of the retainer to the open position. When the retainer 20 is locked in a closed position and when the retention mechanism is being used to hold a PCI card 12 or blanking cover 14 to the chassis 16, at least one of the engagement surfaces 60 of the retainer 20 may contact the tab 38 or other portion of the endplate of the PCI card or the blanking cover. The contact of at least one of the engagement surfaces 60 against a surface of the endplate 24 of a PCI card 12 or blanking cover 14 may inhibit motion of the PCI card or blanking cover. If the retention mechanism 10 is holding a PCI card 12 to the chassis 16 of the computer system 18, the contact of the engagement surfaces 60 against the endplate 24 may prevent the connector edge 28 of the card from becoming uncoupled from the circuit board socket 32.

To move the retainer 20 from a locked and closed position to an open position, a user grasps the grips 48 of the retainer and squeezes the grips. The grips 48 may have ribs 66 that allow the grips to be easily grasped. The ribs 66 may also substantially inhibit a user's grip from slipping from the grips 48 during use. Alternately, the texture of the surfaces of the grips 48 that are grasped by a user may be sanded or roughened with grooves or other texturing patterns to form roughened surfaces. The roughened surfaces may prevent a user's grip from slipping off of the grips 48 when the user grasps the grips. Channel 68 in the body 46 of the retainer 20 is configured to allow the sides of the retainer to approach each other when the grips 48 are squeezed. The grips 48 may function as lever arms that help to reduce the distance between inner channel surfaces 70 of the body 46. When the grips are squeezed, the protrusions 50 may withdraw from engagement with the rotation inhibitor surface 58 and allow the retainer 20 to be rotated into the open position. As shown in FIG. 6, the protrusions 50 may have slanted surfaces 72. The slanted surfaces 72 may facilitate the engagement of the protrusions 50 with the rotation inhibitor surfaces 58 of the carrier 22 when the retainer 20 is rotated from the open position to the closed position.

The retainer 20 may be secured in an open position by forming a friction fit between the body 46 and the rotation stops 62 on the carrier 22. Outer surfaces of the rotation stops 62 may be separated by a distance that is slightly greater than the distance between the inner channel surfaces 70 of the body 46. When the retainer 20 is an open position, the retainer may be rotated until the inner channel surfaces 70 engage the rotation stops 62. The engagement may form a friction fit between the retainer 20 and the carrier 22 that holds the retainer in the open position. When the retainer 20 is held in the open position, the retainer 20 is positioned in an out of the way location so that a PCI card 12 or blanking cover 14 may be easily installed, worked on, or removed from the chassis 16 of the computer system 18 without interference from the retainer.

The color of the carrier 22 may be different than the color of the retainer 20. For example, the carrier may be gray, and the retainer may be purple. Also, the color of the grips 48 may be different than the color of the rest of the retainer 20, such as a lighter shade of purple. The different colors may make the different components of the retention mechanism 10 visually distinctive. The different colors may help users who have never seen or used the retention mechanism 10 to intuitively use the retention mechanism properly.

To install a retention mechanism 10 within a computer system 18, a carrier 22 is mounted to the chassis 16 of the computer system 18 adjacent to openings in the chassis that accommodate PCI card endplates 24 or blanking covers 14. The carrier 22 may be secured to the chassis by fasteners 64. The rotation shaft 44 of at least one retainer 20 is attached to pivot mounts 54 of the carrier 22.

To use the retention mechanism 10 to mount a PCI card 12 within a computer system 18, a retainer 20 that is adjacent to the location where the PCI card is to be installed is secured in an open position by rotating the retainer 20 until inner channel surfaces 70 of the retainer engage rotation stops 62 of the carrier 22. The tongue 40 of the PCI card 12 is securely inserted into the tongue slot 42 of the computer system chassis 16. Securing the tongue 40 within the tongue slot 42 causes the connector edge 28 of the PCI card 12 to be inserted into the socket 32 of the circuit board 34 so that the PCI card is electrically connected to the computer system 18. Securely inserting the tongue 40 into the tongue slot 42 also causes the endplate 24 of the PCI card 12 to be properly positioned on the chassis 16. Securing the tongue 40 in the tongue slot 42 inhibits lateral motion of the PCI card 12. When the endplate 24 is properly positioned, the retainer 20 may be disengaged from the rotation stops 62 and rotated forward into a closed position. The retainer 20 is locked in a closed position when the protrusions 50 inhibit rotation of the retainer to the open position by engaging the rotation inhibitor surfaces 58 of the carrier 22. When the retainer 20 is in the closed position, at least one of the engagement surfaces 60 of the retainer 20 will contact the endplate 24 of the PCI card 12. Preferably, the engagement surfaces 60 of the retainer 20 contact the tab 38 and top 76 of the endplate 24 so that retainer inhibits longitudinal movement and rotational movement of the endplate 24.

A PCI card 12 may be installed into the computer system 18 while the computer system is operating. An advantage of the retention mechanism 10 is that the retention mechanism need not include a separate fastener, such as a small screw, that is used to attach the PCI card 12 to the chassis 16. Eliminating the use of a separate fastener substantially eliminates the chance of a dropping a separate fastener within the operating computer system 18. While the ability to eliminate the separate fastener is an advantage, the use of separate fasteners in conjunction with the retention mechanism 10 is not prohibited. The use of separate fasteners may be needed in particular system embodiments.

Instead of a PCI card 12, a blanking cover 14 may be installed in the computer system 18 to cover an opening in the computer system chassis 16 where an endplate 24 of a PCI card would be positioned. The blanking cover 14 may also be installed in an operating computer system 18.

To remove a PCI card 12 or a blanking cover 14 that is held in a computer system 18 by a retention mechanism 10, a user grasps the grips 48 of the retainer 20. The user squeezes the grips 48 to cause the protrusions 50 to retract towards each other so that the protrusions do not contact the rotation inhibitor surfaces 58 when the retainer 20 is rotated to the open position. The user rotates the retainer 20 to the open position. The retainer 20 may be held in the open position by engaging the rotation stops 62 of the carrier 22 with the inner channel surfaces 70 to form a friction connection between the retainer 20 and the carrier. The user may then grasp the PCI card 12 or blanking cover 14 and remove it from the computer system 18. A card 12 or a blanking cover 14 may be removed from the computer system 18 while the computer system is operating.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A card retention system for retaining a card within a computer system, comprising:
    a card having an endplate;
    a carrier configured to mount within the computer system;
    a retainer configured to be pivotally positioned in the carrier;
    a lock mechanism configured to inhibit rotation of the retainer to an open position when the retainer is in a closed position; and
    wherein at least one surface of the retainer couples to the endplate of the card when the retainer is in the closed position to inhibit movement of the card, and wherein the retainer further comprises a grip configured to facilitate retraction of the protrusion to allow the retainer to be rotated to the open position.

2. The card retention system of claim 1, wherein the lock mechanism comprises an engagement surface on the carrier and a protrusion extending from the retainer, wherein the protrusion interacts with the engagement surface to inhibit rotation of the retainer to the open position.

3. The card retention system of claim 1, further comprising a second retainer rotatably mounted to the carrier adjacent to the retainer, the second retainer configured to hold a second card within the computer system.

4. The card retention system of claim 1, wherein the card comprises a blanking cover.

5. The card retention system of claim 1, wherein the card electrically couples to a circuit board of the computer system, and wherein the retainer inhibits the card from being electrically uncoupled from the circuit board when the retainer is in the closed position.

6. The card retention system of claim 1, wherein a color of the retainer is different than a color of the carrier.

7. The card retention system of claim 1, further comprising a processor coupled to the computer system.

8. A card retention system for a computer system, comprising:
    a card having an endplate;
    a carrier configured to mount within the computer system, the carrier comprising a stop;
    a retainer rotatably positionable in the carrier, wherein the stop of the carrier is configured to hold the retainer in an open position;
    a lock mechanism configured to inhibit rotation of the retainer to the open position when the retainer is in a closed position; and
    wherein at least one surface of the retainer couples to the endplate of the card when the retainer is in the closed position to inhibit movement of the card, and wherein the retainer further comprises a grip configured to facilitate retraction of the protrusion to allow the retainer to be rotated to the open position.

* * * * *

UNITED STATES PATENT AND TRADEMARK OFFICE
CERTIFICATE OF CORRECTION

PATENT NO.    : 6,639,807 B1
DATED         : October 28, 2003
INVENTOR(S)   : Carney et al.

It is certified that error appears in the above-identified patent and that said Letters Patent is hereby corrected as shown below:

<u>Title page,</u>
Item [73], Assignee, delete "Sun Microsoft, Inc, Palo Alto, CA" and insert -- Sun Microsystems, Inc., Santa Clara, CA --.

Signed and Sealed this

Sixteenth Day of May, 2006

JON W. DUDAS
*Director of the United States Patent and Trademark Office*